United States Patent
Levy

(10) Patent No.: US 9,647,680 B2
(45) Date of Patent: May 9, 2017

(54) WALSH ENCODING FOR PERIPHERAL SENSOR INTERFACE 5

(71) Applicant: Infineon Technologies AG, Neubiberg (DE)

(72) Inventor: David Levy, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 106 days.

(21) Appl. No.: 14/603,964

(22) Filed: Jan. 23, 2015

(65) Prior Publication Data
US 2016/0218749 A1  Jul. 28, 2016

(51) Int. Cl.
G06K 7/00 (2006.01)
H03M 5/14 (2006.01)
H04B 1/707 (2011.01)
H04J 13/00 (2011.01)

(52) U.S. Cl.
CPC ............ H03M 5/145 (2013.01); H04B 1/707 (2013.01); H04J 13/0048 (2013.01)

(58) Field of Classification Search
CPC ............. H03M 13/29; H03M 13/2903; H03M 13/2906; F02D 41/28; F02D 2041/281; F02D 2041/283; F02D 2041/285; F02D 2041/286
See application file for complete search history.

(56) References Cited

U.S. PATENT DOCUMENTS

| | | | | |
|---|---|---|---|---|
| 6,301,288 | B1 * | 10/2001 | Molev-Shteiman ... | H04B 1/707 370/515 |
| 7,266,303 | B2 * | 9/2007 | Linden ................... | H04L 27/00 398/140 |
| 8,106,788 | B2 * | 1/2012 | Ohl ........................ | G01D 3/022 340/439 |
| 8,842,026 | B2 | 9/2014 | Levy | |
| 9,112,738 | B2 * | 8/2015 | Szuecs ................... | B60R 21/00 |
| 9,501,446 | B2 * | 11/2016 | Yi ......................... | G06F 13/4291 |
| 2003/0123525 | A1 * | 7/2003 | Smee ................... | H04B 1/7097 375/147 |
| 2016/0138492 | A1 * | 5/2016 | Levy ...................... | F02D 29/02 701/102 |

OTHER PUBLICATIONS

DSI Consortium, "Distributed Systems Interface," http://dsiconsortium.org, Jun. 22, 2010, 30 pages.

(Continued)

*Primary Examiner* — Thien M Le
*Assistant Examiner* — April Taylor
(74) *Attorney, Agent, or Firm* — Harrity & Harrity, LLP

(57) ABSTRACT

A sensor may encode data using a first encoding scheme. The first encoding scheme may include encoding a data bit, included in the data, using a first chip sequence that corresponds to a first set of current levels. A second encoding scheme may be used by another sensor to encode other data. The second encoding scheme may include encoding a data bit, included in the other data, using a second chip sequence that corresponds to a second set of current levels. The first chip sequence and the second chip sequence being different chip sequences. The sensor may modulate a current, based on the first set of current levels, to provide the encoded data.

20 Claims, 13 Drawing Sheets

(56) References Cited

OTHER PUBLICATIONS

Wikipedia, "Hadamard matrix," http://en.wikipedia.org/wiki/Hadamard_matrix, Jan. 1, 2015, 7 pages.
Wikipedia, "Manchester code," http://en.wikipedia.org/wiki/Manchester_code, Nov. 17, 2014, 4 pages.
PSI5, "Peripheral Sensor Interface for Automotive Applications," http://psi5.org/fileadmin/user_upload/01_psi5.org/04_Specification/Specifications_PDFs/110601_psi5_spec_v20_vehicle_dynamics_control.pdf, Jun. 1, 2011, 47 pages.
Wikipedia, "Walsh matrix," http://en.wikipedia.org/wiki/Walsh_matrix, May 5, 2014, 3 pages.

* cited by examiner

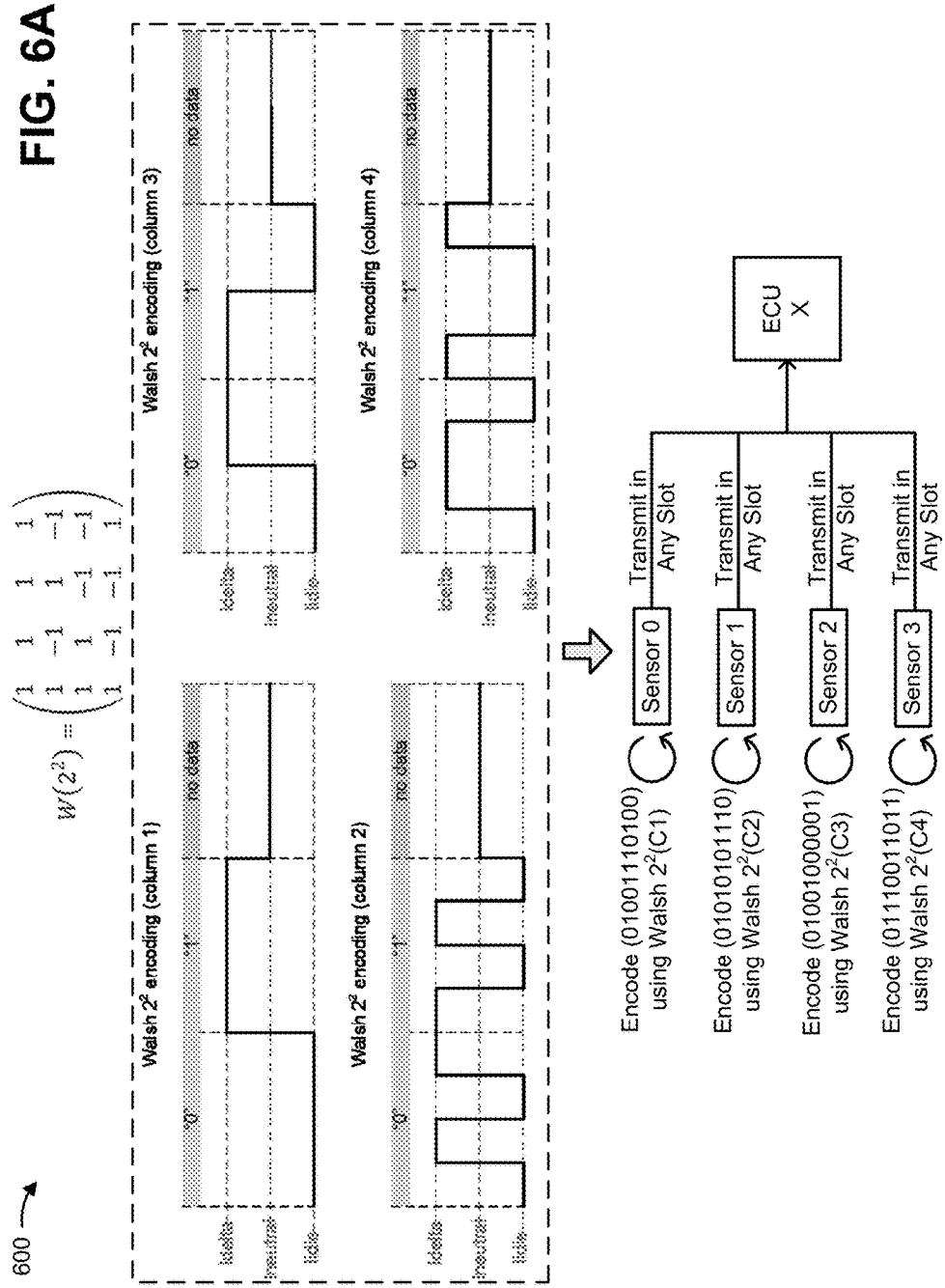

FIG. 6B

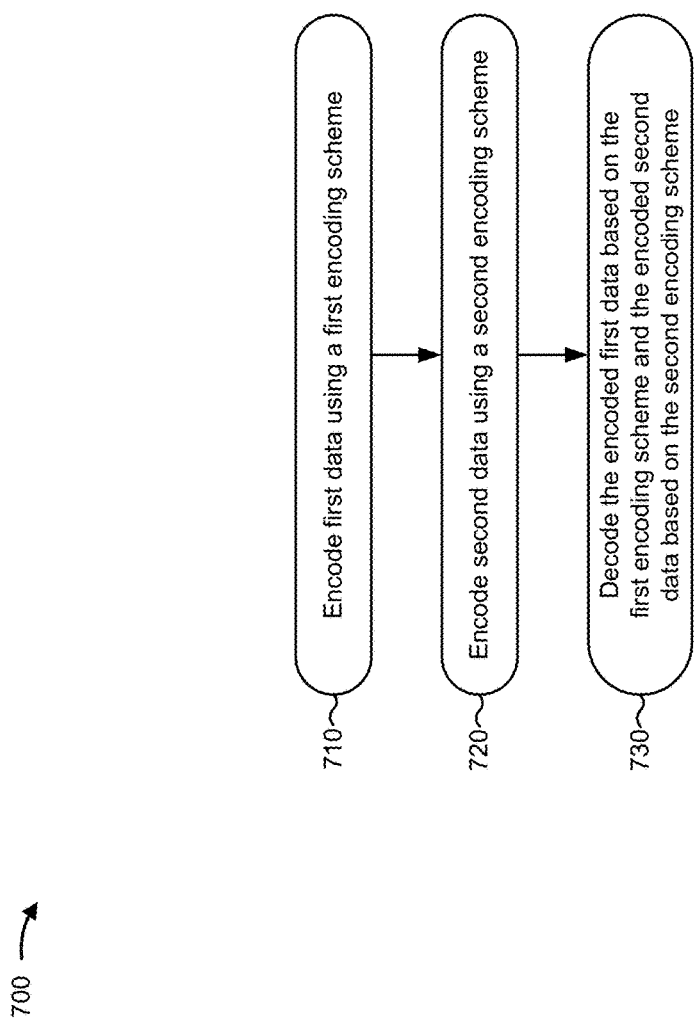

WALSH ENCODING FOR PERIPHERAL SENSOR INTERFACE 5

BACKGROUND

Peripheral Sensor Interface 5 (PSI5) is a digital interface for sensors. PSI5 is a two-wire interface used to connect peripheral sensors to electronic control units (e.g., in automotive electronics). Point-to-point and bus configurations, with asynchronous or synchronous data transmission, are supported by PSI5.

SUMMARY

According to some possible implementations, a sensor may comprise one or more components to: encode data using a first encoding scheme where the first encoding scheme may include encoding a data bit, included in the data, using a first chip sequence that corresponds to a first set of current levels, where a second encoding scheme is used by another sensor to encode other data, where the second encoding scheme may include encoding a data bit, included in the other data, using a second chip sequence that corresponds to a second set of current levels and where the first chip sequence and the second chip sequence may be different chip sequences; and modulate a current, based on the first set of current levels, to provide the encoded data.

According to some possible implementations, a control unit may comprise a receiver to: receive encoded data provided by a sensor, where the encoded data may have been encoded by the sensor based on an encoding scheme associated with a portion of a Hadamard matrix; and decode the encoded data using the portion of the Hadamard matrix.

According to some possible implementations, a method may comprise: encoding, by a first sensor, first data using a first encoding scheme, where the first encoding scheme may include encoding a data bit, included in the first data, based on a first chip sequence that corresponds to a first set of current levels; encoding, by a second sensor, second data using a second encoding scheme, where the second encoding scheme may include encoding a data bit, included in the second data, based on a second chip sequence that corresponds to a second set of current levels, and where the first chip sequence may be different than the second chip sequence; and decoding, by a control unit, the encoded first data based on the first encoding scheme and the encoded second data based on the second encoding scheme.

BRIEF DESCRIPTION OF THE DRAWINGS

FIGS. 6A-6C are diagrams that show an example of Walsh encoding and decoding using a second order Walsh matrix for PSI5; and FIG. 7 is a flow chart of an example process for decoding encoded first data based on first encoding scheme and decoding encoded second data based on a second encoding scheme.

DETAILED DESCRIPTION

Figure 1A:
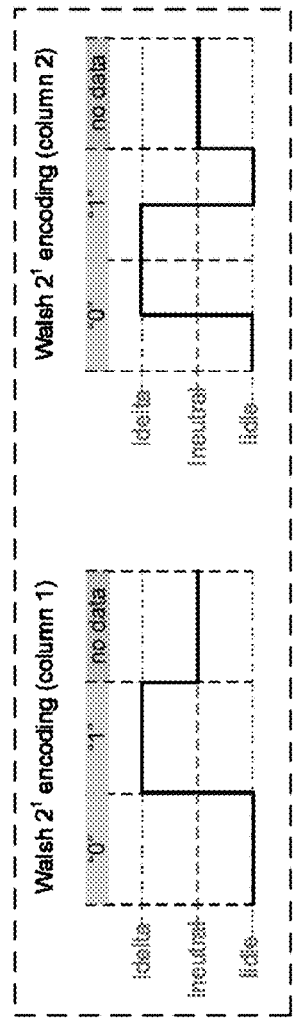
FIGS. 1A and 1B are diagrams of an overview of an example implementation described herein.
Figure 1A:
Figure 1A:
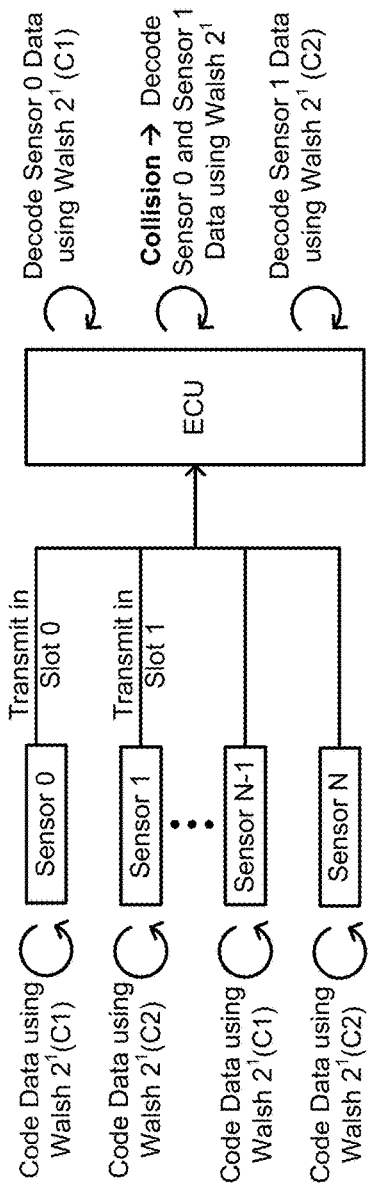

The following detailed description of example implementations refers to the accompanying drawings. The same reference numbers in different drawings may identify the same or similar elements.

PSI5 may allow a sensor to provide data (e.g., one or more bits) to an electronic control unit (ECU). Traditionally, Manchester encoding is used for PSI5. Using Manchester coding, the sensor may transmit data (e.g., sensed by the sensor) by modulating a current that is detectable by the ECU. The ECU may detect transitions between current levels of the current, and may decode the data based on the transitions. For example, based on Manchester encoding, the ECU may decode a first bit as 0 when the ECU detects a transition from a first current level (e.g., an idle current level) to a second current level (e.g., a delta current level) during a period of time associated with the first bit. As another example, the ECU may decode a second bit as 1 when the ECU detects a transition from the second current level to the first current level during a period of time associated with the second bit.

In some cases, multiple sensors may transmit Manchester encoded data using a time division multiple access (TDMA) technique. For example, a first sensor may be configured to provide corresponding Manchester encoded data during a time period corresponding to a first time slot, a second sensor may be configured to provide Manchester encoded data during a time period corresponding to a second time slot (e.g., a time slot immediately following the first time slot), and so on. The ECU may then decode the data for each sensor according to the time slot in which the Manchester encoded data was transmitted.

However, using Manchester encoding for PSI5 may necessitate a wide time slot margin, resulting in a limited amount of data throughput. For example, due to an accumulation of clock inaccuracies associated with each sensor, use of Manchester encoding for PSI5 (in the manner described above) may necessitate an increasingly wide time slot margin (e.g., an amount of time between a transmission by a first sensor and a transmission by a second sensor) in order to avoid collisions of Manchester encoded data received by the ECU. The time slot margin may increase as a time slot duration (e.g., a window of time during which a sensor may transmit a frame of bits) per frame becomes increasingly longer than a frame duration (e.g., an amount of time needed to transmit the frame of bits) associated with the sensors.

As an example, PSI5 standard P10P-500-3L allows for three time slots of 13 bits per frame and for transmissions at 125 kilobits per second (kbps). As such, a frame duration of each frame may be approximately equal to 104 µs (e.g., 13 bits/125 kbps=104 µs). However, the time slot duration may increase in order to account for accumulating clock inaccuracies of sensors transmitting during each time slot, even with a strict clock accuracy requirement (e.g., ±5%). For example, a time slot duration for transmitting a frame during the first time slot may be approximately 137.3 µs, a time slot duration for transmitting a frame during the second time slot may be approximately 149.7 µs, and a time slot duration for transmitting a frame during the third time slot may be approximately 163 µs. As such, the time slot margin may be relatively wide using Manchester encoding for PSI5 standard P10P-500-3L, which may result in limited sensor throughput.

Moreover, using Manchester coding for PSI5 may inherently limit the amount of throughput that may be achieved (e.g., due to the use of the TDMA technique described above), even during optimal conditions (e.g., optimal clock accuracy, optimal time slot margin, optimal frame duration, etc.). For example, use of the TDMA technique for PSI5 standard P10P-500-3L may limit the amount of throughput for a given sensor to 26 kbps (e.g., 13 bits/500 µs=26 kbps) in an optimal condition. Notably, using three current level coding in accordance with Distributed System Interface version 3 (DSI3) standards may allow for a throughput of 40 kbps (e.g., 20 bits/500 µs=40 kbps). However, use of such three level coding may be undesirable due to encoding and/or decoding complexities (e.g., associated with the three current level coding) and reduced robustness that results from using DSI3.

Implementations described herein may use Walsh encoding for transmitting sensor data using PSI5 (e.g., rather than using Manchester encoding). Walsh encoding may allow for an increased amount of throughput and/or a relaxed clock accuracy requirement as compared to using Manchester encoding for PSI5. Moreover, use of Walsh encoding for PSI5 may allow a code division multiple access (CDMA) technique to be implemented for current modulation.

Figure 1B:
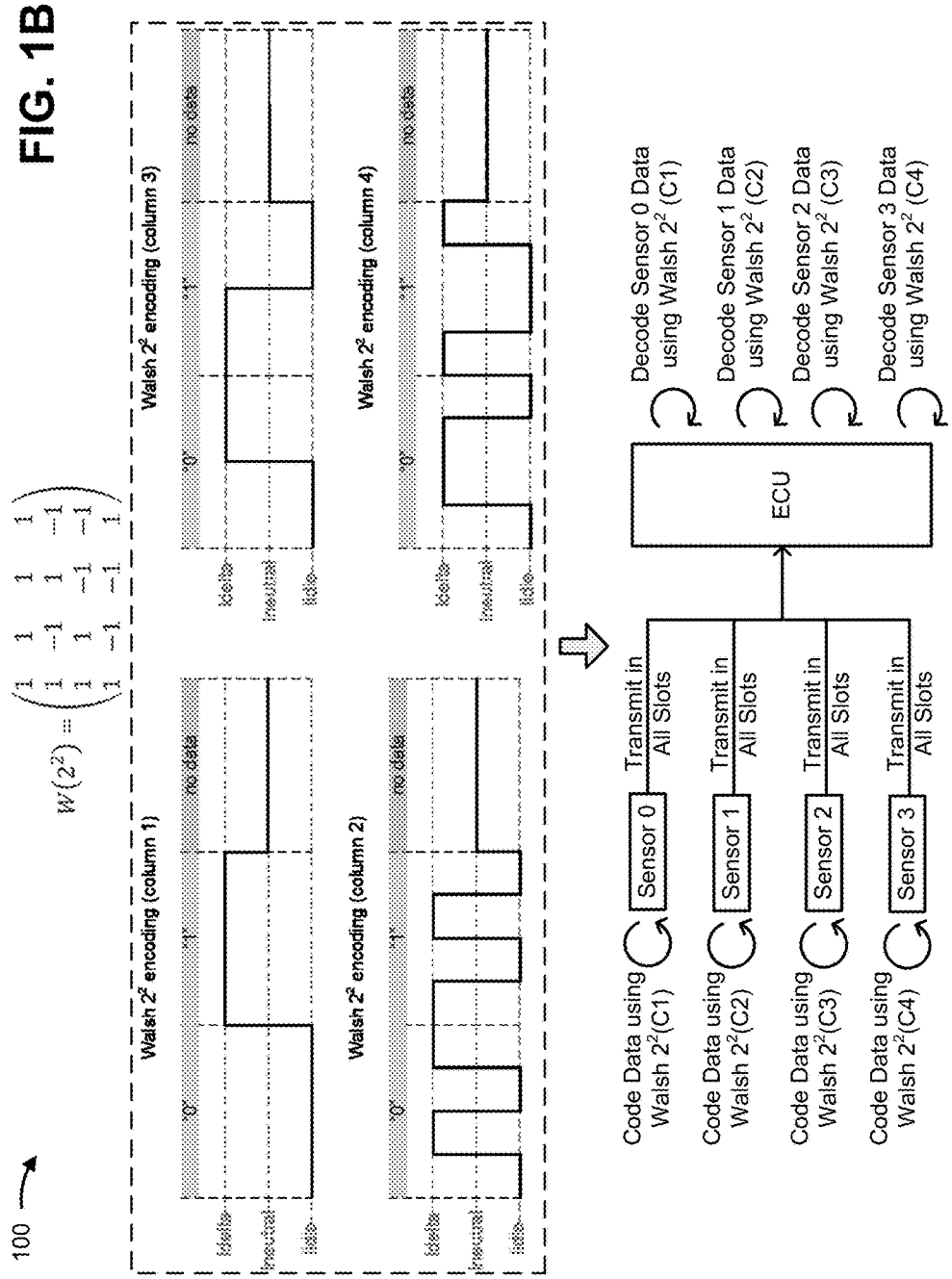

FIGS. 1A and 1B are diagrams of an overview of an example implementation 100 described herein. FIG. 1A shows an overview of an example associated with encoding and decoding data using a first order Walsh matrix for PSI5. For the purposes of FIG. 1A, assume that a group of sensors (e.g., sensor 0 through sensor N) is connected to an ECU such that the group of sensors may transmit data using PSI5. Further, assume that sensor 0 is configured to transmit data during a first time slot (e.g., slot 0), sensor 1 is configured to transmit data during a second time slot (e.g., slot 1), sensor N−1 is configured to transmit data during a time slot immediately preceding an Nth time slot (e.g., slot N−1), and sensor N is configured to transmit data during the Nth time slot (e.g., slot N).

As shown in FIG. 1A, the group of sensors may be configured to alternately encode data using columns of a first order Walsh matrix (e.g., $W(2^1)$). For example, as shown (and where N is an odd number), sensor 0 may be configured to encode data based on a first column of the first order Walsh matrix (e.g., $(1\ 1)^t$), sensor 1 may be configured to encode data using a second column of the first order Walsh matrix (e.g., $(1\ -1)^t$), sensor N−1 may be configured to encode data using the first column of the first order Walsh matrix (e.g., $(1\ 1)^t$), and sensor N may be configured to encode data using the second column of the first order Walsh matrix (e.g., $(1\ -1)^t$). In other words, each sensor may be configured to encode data using one column of the first order Walsh matrix such that a time slot immediately preceding the time slot in which the sensor is to transmit, and a time slot immediately following the time slot in which the sensor is to transmit, include data encoded using the other column of the first order Walsh matrix. Here, due to the use of Walsh encoding using the first order Walsh matrix, a time slot margin (e.g., an amount of time between a transmission in a time slot and a transmission in a subsequent time slot) may be reduced (e.g., to zero, to less than zero, etc.), and collisions (e.g., an overlap between transmission in the time slot and the transmission in the subsequent time slot) may be resolved by the ECU.

For example, as shown, sensor 0 may encode sensor 0 data using the first column of the first order Walsh matrix, and sensor 1 may encode sensor 1 data using the second column of the first order Walsh matrix. If the first column of the first order Walsh coding is used, since the first column of the first order Walsh matrix is $(11)^t$, then a data bit of 1 may be encoded and transmitted with current levels such that both chips of the data bit are at current level 1 (Idelta), while a data bit of 0 may be encoded and transmitted with reversed current levels (i.e. such that current levels for both chips of the data bit are at current level 0 (Iidle)). If the second column of the first order Walsh coding is used, since the second column of the first order Walsh matrix is $(1-1)^t$, a data bit of 1 may be encoded and transmitted with a current level of 1 (Idelta) for a first chip of the data bit and a current level of −1 (Iidle) for a second chip of the data bit. In other words, the sequence of chips that represent a transmitted data bit of 1 may correspond to the sequences of 1s and −1s of the respective column of the Walsh matrix that is used for encoding the data bit, and the sequence of chips that represent a transmitted data bit of 0 may be the reverse of the transmitted data bit of 1. If the sensor is not transmitting any data, then the sensor may provide the neutral current level (rather than providing the two current levels Idelta or Iidle used for representing data bits 0 and 1).

As shown, sensor 0 may transmit the sensor 0 encoded data in slot 0 (e.g., by modulating a current detectable by the ECU). However, assume that (e.g., due to a clock inaccuracy of a sensor 1 clock), sensor 1 begins transmitting the sensor 1 encoded data (e.g., by modulating the current detectable by the ECU) before sensor 0 finishes transmitting the sensor 0 encoded data (e.g., such that the ECU concurrently detects current levels corresponding to a portion of the sensor 0 encoded data and a portion of the sensor 1 encoded data for a period of time). Here, due to code diversity (e.g., since the sensor 0 data is encoded using the first column of the first order Walsh matrix, and since the sensor 1 data is encoded using the second column of the first order Walsh matrix), the ECU may resolve the collision and may correctly decode the concurrently received sensor 0 encoded data and sensor 1 encoded data. The ECU may similarly resolve collisions of encoded data between other sensors of the group of sensors. Since the ECU may resolve such collisions, a time slot margin between any two time slots may be reduced (e.g., to zero, to less than zero). With a reduced time slot margin sensor throughput may be increased. With a relaxed clock accuracy requirement, a cost associated with the sensor may be reduced. In this way, Walsh encoding may be used for transmitting sensor data using PSI5 such that an amount of throughput may be increased and/or a clock accuracy requirement may be relaxed (e.g., as compared to using Manchester encoding for PSI5). It is to be noted that in the above described embodiment, multiple sensors use a same column of the Walsh matrix for encoding, however the transmission of the sensors may be configured such that a sensor that is scheduled to transmit next (e.g., in a successive time slot) may use, for encoding, the respective column of the first order Walsh matrix that is not being used by the currently transmitting sensor.

FIG. 1B shows an overview of an example associated with encoding and decoding data using a second order Walsh matrix for PSI5. For the purposes of FIG. 1B, assume that a group of sensors (e.g., sensor 0 through sensor 3) are connected to an ECU such that the group of sensors may transmit data using PSI5.

As shown in FIG. 1B, the group of sensors may be configured to encode data using columns of a second order Walsh matrix (e.g., $W(2^2)$). For example, as shown, sensor 0 may be configured to encode data based on a first column of the second order Walsh matrix (e.g., $(1\ 1\ 1\ 1)^t$), sensor 1 may be configured to encode data using a second column of the second order Walsh matrix (e.g., $(1\ -1\ 1\ -1)^t$), sensor 2 may be configured to encode data using a third column of the second order Walsh matrix (e.g., $(1\ 1\ -1\ -1)^t$), and sensor 3 may be configured to encode data using a fourth column of the second order Walsh matrix (e.g., $(1\ -1\ -1\ 1)^t$). In other words, each sensor may be configured to encode data using a different column of the second order Walsh matrix.

Here, since each of the sensors is assigned to use one of columns of the Walsh matrix for encoding, with each column being assigned uniquely (to only one sensor), each sensor may concurrently transmit encoded data in any and/or all time slots, and the ECU may correctly decode data corresponding to each sensor. For example, as shown, sensor 0 may encode sensor 0 data using the first column of the second order Walsh matrix, sensor 1 may encode sensor 1 data using the second column of the second order Walsh matrix, sensor 2 may encode sensor 2 data using the third column of the second order Walsh matrix, and sensor 3 may encode sensor 3 data using the fourth column of the second order Walsh matrix. As further shown, the group of sensors may concurrently transmit (e.g., by modulating a current detectable by the ECU) encoded data in any and/or all time slots.

As shown, the ECU may receive the encoded data, and, based on the first column of the second order Walsh matrix, the second column of the second order Walsh matrix, the third column of the second order Walsh matrix, and the fourth column of the second order Walsh matrix, may correctly decode the encoded sensor 0 data, the encoded sensor 1 data, the encoded sensor 2 data, and the encoded sensor 3 data, respectively. In other words, the ECU may correctly decode the sensor data due to code diversity among the encoded data. By allowing for concurrent transmission of encoded data, sensor throughput may be increased. In this way, Walsh encoding may be used for transmitting sensor data using PSI5 such that an amount of throughput may be increased (e.g., as compared to using Manchester encoding for PSI5). Moreover, use of Walsh encoding in this manner may allow a CDMA technique to be implemented for current modulation.

Figure 2:
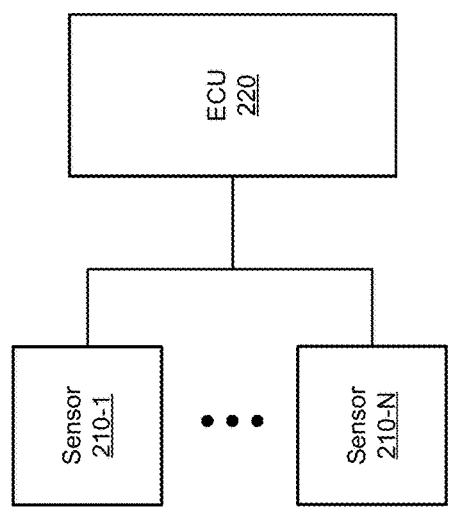
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include one or more sensors 210-1 through 210-N (N≥1) (hereinafter referred to collectively as sensors 210, and individually as sensor 210) and an ECU 220. Devices of environment 200 may interconnect via a wired connection, such as a two-wired connection associated with PSI5.

Sensor 210 may include a sensing device that detects an event and/or a change in a quantity and provides a corresponding output. For example, sensor 210 may include a peripheral sensor associated with automotive electronics, such as an airbag sensor. In some implementations, sensor 210 may be connected to ECU 220 such that sensor 210 may transmit data to ECU 220 using PSI5. In some implementations, one or more sensors 210 may be connected to ECU 220 using a bus topology (e.g., a basic bus topology, a daisy chain bus topology, a parallel bus mode topology, etc.), or another topology in accordance with PSI5. In some implementations, sensor 210 may be capable of encoding data (e.g., information sensed by sensor 210) using a column of a Walsh matrix, as described below. Additional details of sensor 210 are described below with regard to FIGS. 3A-3C.

ECU 220 may include a device associated with controlling one or more electrical systems and/or electrical subsystems, for example, one or more electrical systems and/or one electrical subsystems included in a motor vehicle. For example, ECU 220 may include an electronic/engine control module (ECM), a powergain control module (PCM), a transmission control module (TCM), a brake control module (BCM or EBCM), a central control module (CCM), a central timing module (CTM), a general electronic module (GEM), a body control module (BCM), a suspension control module (SCM), or the like. In some implementations, ECU 220 may be connected to sensors 210 such that ECU 220 may receive encoded data transmitted by sensors 210 using PSI5 (e.g., in the form of a modulated current). In some implementations, ECU 220 may be capable of decoding Walsh encoded data, as described below. Additional details of ECU 220 are described below with regard to FIG. 4.

The number and arrangement of devices shown in FIG. 2 are provided as an example. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3A:
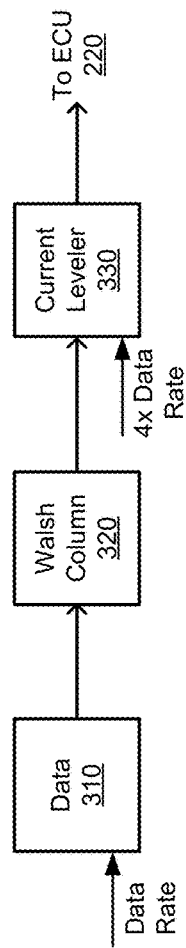
FIG. 3A is a diagram of example components of a sensor included in the example environment of FIG. 2.

FIG. 3A is a diagram of example components of sensor 210. As shown in FIG. 3A, sensor 210 may include a data component 310, a Walsh column component 320, and a current leveler 330.

Data component 310 may receive, obtain, determine, and/or generate data (e.g., one or more bits, such as a bit stream of zeroes and/or ones) that corresponds to a sensing function of sensor 210. In some implementations, data component 310 may receive, obtain, determine, and/or generate the data at a data rate in accordance with PSI5, such as 125 kbps or 189 kbps. In some implementations, data component 310 may provide the data to Walsh column component 320 for Walsh encoding based on a Walsh column included in a Walsh matrix.

Walsh column component 320 may include a component associated with encoding data (e.g., provided by data component 310) based on a column of a Walsh matrix. For example, Walsh column component 320 may encode a bit by determining, based on a column of the Walsh matrix, a set of encoded values (e.g., a set of two values, a set of four values, etc.) that represents the bit.

In some implementations, Walsh column component 320 may be configured to encode the data based on a first order Walsh matrix. For example, assume that Walsh column component 320 is configured to encode data, provided by data component 310, using a first column of a first order Walsh matrix:

$$W(2^1) = \begin{pmatrix} 1 & 1 \\ 1 & -1 \end{pmatrix}$$

Here, if a bit is a 1, then Walsh column component 320 may encode the bit as a set of encoded values of (1 1). Similarly, if a bit is a 0, then Walsh column component 320 may encode the bit as a set of encoded values of (−1 −1) (e.g., based on the inverse of the first column of the first order Walsh matrix). As another example, assume that Walsh column component 320 is configured to encode data, provided by data component 310, using a second column of the first order Walsh matrix. Here, if a bit is a 1, then Walsh column component 320 may encode the bit as a set of encoded values of (1 −1). Similarly, if a bit is a 0, then Walsh column component 320 may encode the bit as a set of encoded values of (−1 1) (e.g., based on the inverse of the second column of the first order Walsh matrix).

As another example, assume that Walsh column component 320 is configured to encode data, provided by data component 310, using a first column of a second order Walsh matrix:

$$W(2^2) = \begin{pmatrix} 1 & 1 & 1 & 1 \\ 1 & -1 & 1 & -1 \\ 1 & 1 & -1 & -1 \\ 1 & -1 & -1 & 1 \end{pmatrix}$$

Here, if a bit is a 1, then Walsh column component 320 may encode the bit as a set of encoded values of (1 1 1 1). Similarly, if a bit is a 0, then Walsh column component 320 may encode the bit as a set of encoded values of (−1 −1 −1 −1) (e.g., based on the inverse of the first column of the second order Walsh matrix). As another example, assume that Walsh column component 320 is configured to encode data, provided by data component 310, using a third column of the second order Walsh matrix. Here, if a bit is a 1, then Walsh column component 320 may encode the bit as a set of encoded values of (1 1 −1 −1). Similarly, if a bit is a 0, then Walsh column component 320 may encode the bit as a set of encoded values of (−1 −1 1 1) (e.g., based on the inverse of the third column of the second order Walsh matrix).

In some implementations, sensors 210 be assigned to encode data using alternating columns of a Walsh matrix. For example, if a first sensor 210 (e.g., configured to transmit in a first time slot), a second sensor 210 (e.g., configured to transmit in a second time slot), and a third sensor 210 (e.g., configured to transmit in a third time slot) are connected to ECU 220, then the first sensor 210 may be assigned to encode data using the first column of the first order Walsh matrix, the second sensor 210 may be assigned to encode data using the second column of the first order Walsh matrix, and the third sensor 210 may be assigned to encode data using the first column of the first order Walsh matrix. This may allow a time slot margin to be reduced (e.g., to zero, to less than zero, etc.) while allowing ECU 220 to correctly decode encoded data provided by each sensor, even in the presence of a collision (e.g., due to code diversity of adjacent time slots).

While implementations described herein are described in the context of Walsh column component 320 using one or more of two encoding schemes based on first order Walsh matrix or one or more of four different encoding schemes based on a second order Walsh matrix, in some implementations, Walsh column component 320 may use another quantity of encoding schemes (e.g., based on another type of matrix) for data encoding, such as one or more of eight encoding schemes based on a third order Walsh matrix, a quantity of encoding schemes based on a Hadamard matrix (e.g., a square matrix with entries of either −1 or 1 and including mutually orthogonal columns), or one or more of $2^n$ (e.g., n=1, 2, 3, 4, etc.) encoding schemes based on another type of square matrix with dimensions of $2^n$ that includes values of 1 and −1 such that a scalar product of any two columns is equal to zero.

Additionally, or alternatively, sensors 210 may be assigned to encode data using successive columns of a Walsh matrix. For example, if a first sensor 210, a second sensor 210, a third sensor 210, and a fourth sensor 210 (e.g., each configured to concurrently transmit in any and/or all time slots) are connected to ECU 220, then the first sensor 210 may be assigned to encode data using the first column of the second order Walsh matrix, the second sensor 210 may be assigned to encode data using the second column of the second order Walsh matrix, the third sensor 210 may be assigned to encode data using the third column of the second order Walsh matrix, and the fourth sensor 210 may be assigned to encode data using the fourth column of the second order Walsh matrix. This may allow ECU 220 to correctly decode encoded data provided by each sensor, despite being concurrently transmitted by the four sensors 210 (e.g., due to code diversity between sensors 210).

In some implementations, Walsh column component 320 may provide the encoded data to current leveler 330 in order to allow current leveler 330 to modulate a current that is detectable by the ECU 220.

Current leveler 330 may include a component associated with converting encoded data (e.g., a group of sets of encoded values) to a sequence of current levels by modulating a current (e.g., detectable by ECU 220). For example, current leveler 330 may include a digital to analog converter (DAC) or another type of component associated with converting a digital representation of information to an analog representation of that information.

In some implementations, a current level may correspond to a value included in encoded data. For example, an idle current level (e.g., Iidle, corresponding to an amount of current consumed by sensor 210) may correspond to an encoded bit value of −1, a delta current level (e.g., Idelta, corresponding to the amount of current consumed by sensor 210 plus a first amount of current, such as 26 milliamps (ma)) may correspond to an encoded bit value of 1, and a neutral current level (e.g., Ineutral, corresponding to the amount of current consumed by sensor 210 plus a second amount of current that is less than the first amount of current, such as 13 ma) may correspond to no data being transmitted by sensor 210. In some embodiments, the neutral current level may be equal to a sum of the idle current level and half of a difference between the delta current level and the idle current level (i.e., Ineutral=Iidle+[(Idelta−Iidle)/2)]).

In some implementations, current leveler 330 may modulate the current such that a sequence of current levels represents a corresponding set of encoded values, where each current level remains unchanged for a length of time equal to one chip. A chip may include a minimum duration of time for which there is no current level change. For example, a chip length for Walsh encoding based on the first order Walsh matrix may be one half of a bit (e.g., since a bit may be encoded as a set of two values, the encoded bit may be represented by two current levels). In other words, there are two chips per bit for Walsh encoding using the first order Walsh matrix. As another example, a chip length for Walsh encoding based on the second order Walsh matrix may be one fourth of a bit (e.g., since a bit may be encoded as a set of four values, the encoded bit may be represented by four current levels). In other words, there are four chips per bit for Walsh encoding using the second order Walsh matrix.

In some implementations, the sequence of current levels representing the set of encoded values may be referred to as a chip sequence. In some implementations, a first chip sequence may be orthogonal to a second chip sequence. A first chip sequence may be orthogonal to a second chip sequence when the first chip sequence has a same length as the second chip sequence (e.g., 2 chips, 4 chips, etc.) and a number of chips in which the first chip sequence and the second chip sequence include the same current level is equal to a number of chips in which the first chip sequence and the second chip sequence include different current levels. For example taking a first chip sequence corresponding to the first column of the second order Walsh matrix (e.g., (1 1 1 1)$^t$) and second chip sequence corresponding to the second column of the second order Walsh matrix (e.g., (1 −1 1 −1)$^t$), the first chip sequence and the second chip sequence include chips with a same current level at a first position (e.g., both 1) and a third position (e.g., both 1). Similarly, the first chip sequence and the second chip sequence include chips with different current levels at a second position (e.g., 1 and −1) and a fourth position (e.g., 1 and −1). A similar example, may be seen with respect to the second column of the second order Walsh matrix and the third column of the second order Walsh matrix (e.g., (1 1 −1 −1)$^t$).

Figure 3B:
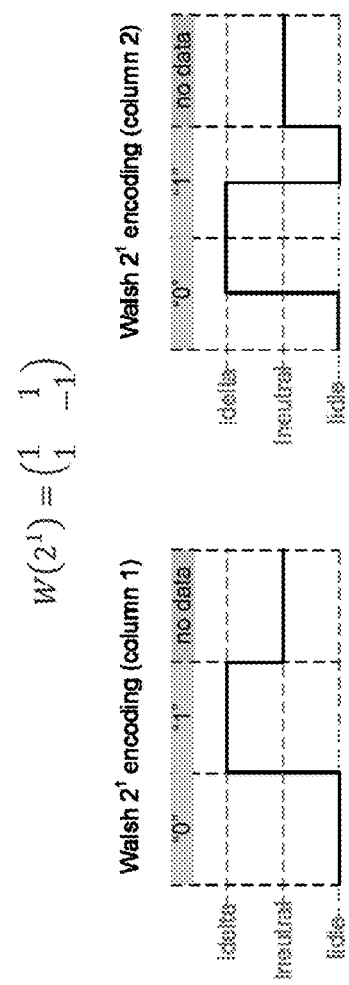
FIGS. 3B and 3C show examples of a manner in which a current may be modulated to represent data encoded using a first order Walsh matrix and a second order Walsh matrix, respectively.
Figure 3C:
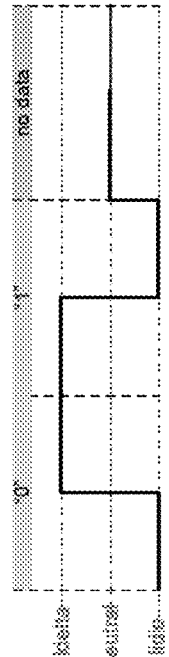
Figure 3C:
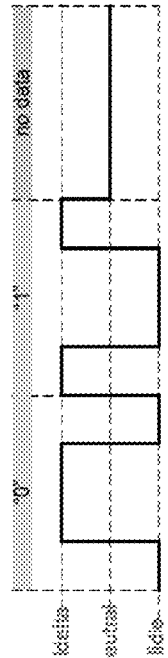
Figure 3C:
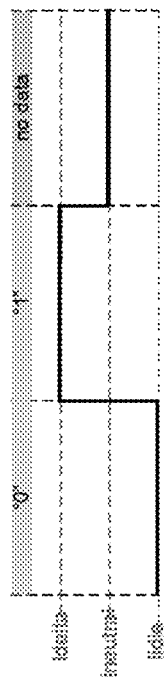
Figure 3C:
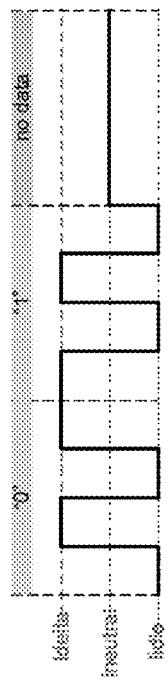

In some implementations, current leveler 330 may modulate the current based on the chip sequence that corresponds to the set of encoded values. For example, assume that Walsh column component 320 encodes a 0 bit, using the first column of the first order Walsh, as (−1−1). Here, current leveler 330 may modulate the current by lowering the current level from the neutral current to the idle current for a duration of two chips. As another example, assume that Walsh column component 320 encodes a 1 bit, using the second column of the first order Walsh, as (1−1). Here, current leveler 330 may modulate the current by raising the current level from the neutral current to the delta current during a first chip, and lowering the current level to the idle current during a second chip. As yet another example, assume that Walsh column component 320 encodes a 1 bit, using the second column of the second order Walsh, as (1 −1 1−1). Here, current leveler 330 may modulate the current by raising the current level from the neutral current to the delta current during a first chip, lowering the current level to the idle current during a second chip, raising the current level to the delta current during a third chip, and lowering the current level to the idle current during a fourth chip. FIGS. 3B and 3C show examples of a manner in which a current may be modulated to represent data encoded using a first order Walsh matrix and a second order Walsh matrix, respectively.

In some implementations, current leveler 330 may modulate the current at a rate that that is greater than the data rate. For example, current leveler 330 may modulate the current at a rate of four times per bit when the data is encoded using the second order Walsh matrix. In some implementations, the current, as modulated by current leveler 330, may be detected by ECU 220, and ECU 220 may decode the encoded data, as described below.

The number and arrangement of components shown in FIG. 3A are provided as an example. In practice, sensor 210 may include additional components, fewer components, different components, or differently arranged components than those shown in FIG. 3A. Additionally, or alternatively, a set of components (e.g., one or more components) of sensor 210 may perform one or more functions described as being performed by another set of components of sensor 210.

Figure 4:
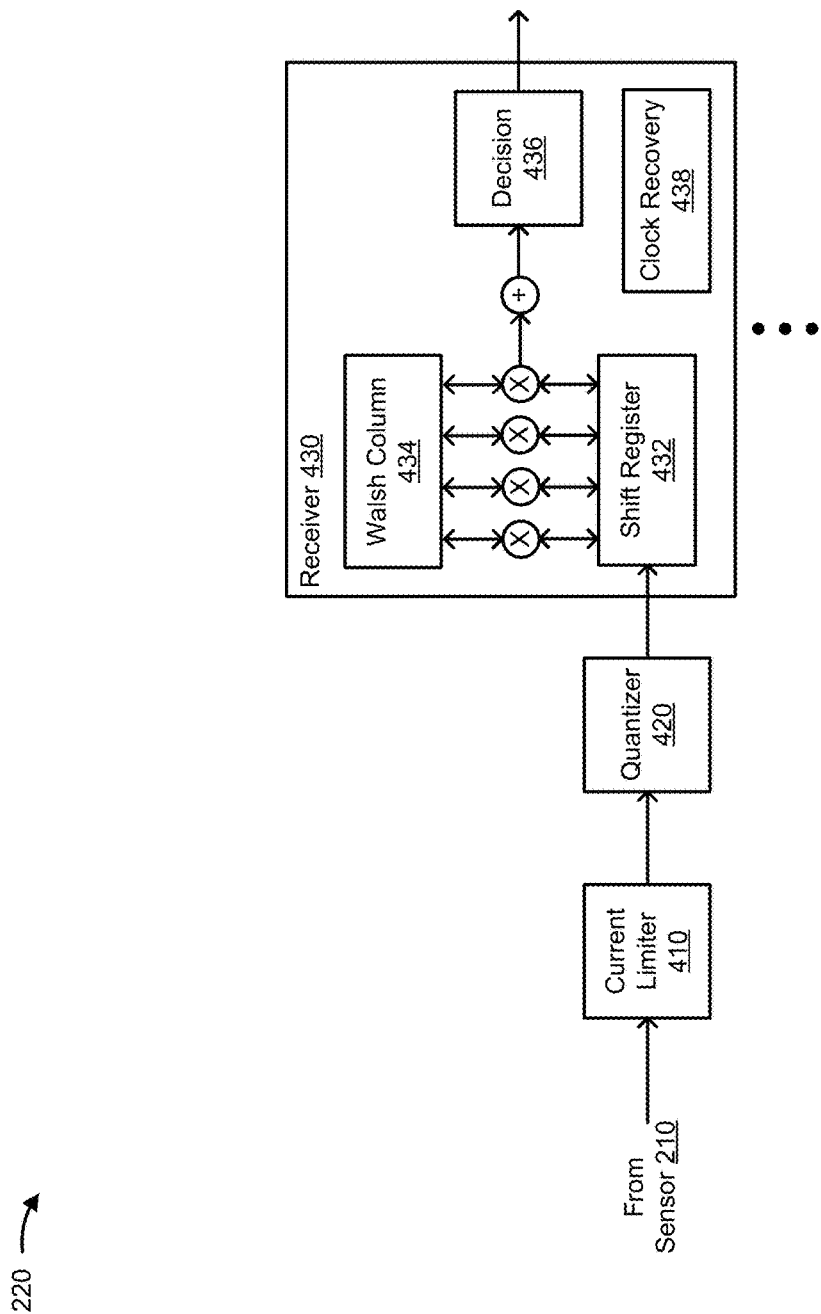
FIG. 4 is a diagram of example components of an electronic control unit included in the example environment of FIG. 2.

FIG. 4 is a diagram of example components of ECU 220. As shown in FIG. 4, ECU 220 may include a current limiter 410, a quantizer 420, and a receiver 430 that may include a shift register 432, a Walsh column component 434, a decision component 436, and a clock recovery component 438. In some implementations, ECU 220 may include multiple receivers 430, as described below.

Current limiter 410 may include a component associated with limiting a current detected by ECU 220. In some implementations, current limiter 410 may limit the current to the delta current level or the idle current level. For example, if current leveler 330 modulates the current such that the current level is above the delta current or below the idle current level (e.g., when two sensors 210 are concurrently transmitting data), then current limiter 410 may limit the current detected by ECU 220 to the delta current level or the idle current level, respectively. In some implementations, current limiter 410 may limit the current in order to reduce dissipation and/or in order to reduce unnecessary consumption. Current limiting by current limiter 410 does not affect decoding of Walsh encoded data.

In some implementations, the current level to which current limiter 410 may limit the current may be based on a delta current level (e.g., Idelta) and a idle current level (e.g., Iidle) corresponding to a quantity of sensors 210 connected to ECU 220. For example, assume that four sensors 210 are connected to ECU 220, and that current limiter 410 is positioned to limit a current detected by ECU 220. Further, assume that, based on a configuration of current limiter 410, the delta current level is to be 6 mA greater than the neutral current level and the netural current level is to be 6 mA greater than the idle current level (e.g., Idelta−Ineutral=Ineutral−Iidle=6 mA). Also, assume that each sensor 210 consumes 8 mA of current at an idle level. In this example, the neutral current level corresponding to the four sensors 210 is equal to 56 mA, or 14 mA per sensor 210 (e.g., 4×(8 mA+6 mA)=56 mA). As such, when no data is being transmitted by any sensor 210, the current level detected by ECU 220 is 56 mA. Here, current limiter 410 may be configured to limit detected current that is greater than or equal to 65 mA (e.g., Ineutral+(Idelta−Ineutral)+3 mA margin=56+6+3=65 mA). Similarly, current limiter 410 may be configured to limit current that is less than or equal to 47 mA (e.g., Ineutral−(Ineutral−Iidle)−3 mA margin=56−6−3=47 mA). By limiting the current in this way, ECU 220 may be capable of correctly decoding data in any transmission case associated with the four sensors 210 (e.g., when only one sensor 210 is transmitting data, when only two sensors 210 are concurrently transmitting data, when three sensors 210 are concurrently transmitting data, and when all four of sensors 210 are concurrently transmitting data).

Quantizer 420 may include a component configured to convert a sequence of current levels to a set of current values. For example, quantizer 420 may include an analog to digital (ADC) converter, or another type of component associated with converting an analog representation of information to a digital representation of that information. In some implementations, quantizer 420 may convert a sequence of current levels to one or more sets of current values that correspond to one or more encoded bits. For example, assume that ECU 220 is configured to decode encoded data using a first order Walsh matrix. Here, if quantizer 420 samples the current and detects the idle current during a first chip, and the delta current during a second chip, then quantizer 420 may convert the sequence of current levels to a set of current values that includes (−1 1). As another example, assume that ECU 220 is configured to decode encoded data using a second order Walsh matrix. Here, if quantizer 420 detects the idle current during a first chip, a second chip, and a third chip, and the delta current during a fourth chip, then quantizer 420 may convert the sequence current levels to a set of current values that includes (−1 −1 −1 1).

In some implementations, quantizer 420 may sample the current level at a rate that is greater than the data rate (e.g., since each bit may be represented by current levels across multiple chips). For example, quantizer 420 may sample the current at four times the data rate for Walsh encoding using the second order Walsh matrix (e.g., since each bit is represented by current levels across four chips). Additionally, or alternatively, quantizer 420 may oversample the current (e.g., in order to eliminate effects of clock inaccuracies). In other words, quantizer 420 may sample the current multiple (e.g., four, ten, twenty, etc.) times per chip. For example, assume that Walsh encoding using the second order Walsh matrix is implemented (e.g., such that each bit is represented by current levels across four chips), and that quantizer 420 is configured to sample each chip four times. Here, quantizer 420 may sample the current 16 times per bit (e.g., four chips per bit times four samples per chip). In some implementations, quantizer 420 may oversample the current in order to determine an accurate correlation score in light of clock inaccuracies (e.g., such that encoded data sent at an incorrect time may still be decoded). For purposes of simplification, implementations described herein may be described in the context of sampling the current once per chip. In some implementations, quantizer 420 may provide the set of current values to receiver 430 for decoding and/or further processing.

Receiver 430 may include a component associated with decoding Walsh encoded data based on a set of current values determined by quantizer 420. In some implementations, ECU 220 may include one or more receivers 430. For example, ECU 220 may include one or more receivers 430, and each receiver 430 may be configured to decode encoded data based on one or more columns of a Walsh matrix (e.g., one receiver may be configured to decode data associated with one column of the Walsh matrix, two columns of the Walsh matrix, four columns of the Walsh matrix, etc.). In some implementations, receiver 430 may include a shift register 432, a Walsh column component 434, a decision component 436, and a clock recovery component 438.

Shift register 432 may include a group of flip-flops that stores a set of current values provided by quantizer 420. In some implementations, a bit may be decoded based on the set of current values and a column of a Walsh matrix (e.g., associated with Walsh column component 434). In some implementations, shift register 432 may have a length that corresponds to the quantity of chips per bit and/or a rate at which quantizer 420 samples the current. Continuing with the above example, if quantizer 420 samples the current 16 times per bit, then the shift register 432 may be 16 flip-flops long. In some implementations, shift register 432 may provide each value, of the set of values, to a corresponding multiplier (e.g., included in receiver 430) such that receiver 430 may decode an encoded bit represented by the set of current values, as described below.

Walsh column component 434 may include a component associated with decoding data (e.g., represented by the set of current values stored in shift register 432) based on a column of a Walsh matrix (or another type of matrix, as described above). For example, Walsh column component 434 may store information that represents a column of a Walsh matrix, such that a bit, encoded using the column of the Walsh matrix, may be determined based on the set of current values.

In some implementations, Walsh column component 434 may provide each entry of the column of the Walsh matrix to a corresponding multiplier, and each entry may be multiplied by a corresponding current value, of the set of current values, in order to determine a set of multiplication results.

For example, assume that shift register 432 receives a set of current values that includes (0 1 0 0), and that Walsh component 432 stores information associated with the fourth column of the second order Walsh matrix (e.g., $(1\ -1\ -1\ 1)^r$). Here, each value, of the set of current values, may be multiplied by a corresponding entry of the fourth column of the second order Walsh matrix in order to determine a set of multiplication results that includes 0, −1, 0, and 0 (e.g., since 0×1=0, 1×−1=−1, 0×1=0, and 0×1=0). In some implementations, the set of multiplication results may then be summed and provided to decision component 436. Continuing with the above example, the set of multiplication results may be summed to −1 (e.g., 0+−1+0+0=−1).

In some implementations, multiple sets of multiplication results (e.g., and corresponding sums) may be determined based on a single set of current values (e.g., when each receiver 430, of a group of receivers 430, includes a Walsh column component 434 associated with a different column of a Walsh matrix). As such, due to code diversity, encoded data provided by multiple sensors may be decoded even when concurrently provided (e.g., as a result of a collision, when sensors 210 are configured to concurrently transmit, etc.).

Decision component 436 may include a component configured to determine a decoded value of a bit. In some implementations, decision component 436 may determine the decoded value based on the sum of the set of multiplication results. For example, in some implementations, the sum of the set of multiplication results may represent a correlation score (e.g., a value indicating whether an encoded bit is to be decoded as a 0 or a 1). In some implementations, a negative correlation score (e.g., −1, −2, −3, etc.) may indicate that an encoded bit is to be decoded as a 0. Similarly, a positive correlation score (e.g., 1, 2, 3, etc.) may indicate that an encoded bit is to be decoded as a 1. A weak correlation score (e.g., a correlation score approximately equal to 0) may indicate that no data, encoded using the column of the Walsh matrix, was represented by the modulated current. Continuing with the above example, since the sum of the set of multiplication results is −1, decision component 436 may determine that the encoded bit is to decoded as 0. In some implementations, decision component 436 may provide the decoded data as output (e.g., a decoded bit stream) after decoding the Walsh encoded data.

In some implementations, decision component 436 may determine the decoded value of the encoded bit based on a change in correlation score over time. For example, decision component 436 may determine a string of correlation scores (e.g., as data is received by ECU 220), and may monitor for an increase or decrease in the stream of correlation scores. In some implementations, a sharp increase or a sharp decrease in correlation score (e.g., over a short period of time, such as a portion of one chip), as compared to a slow increase or a slow decrease in correlation score (e.g., over long period of time, such as four chips) may indicate that a bit has been received. In such a case, decision component 436 may determine the decoded value of the encoded bit based on the correlation score immediately preceding the sharp increase or sharp decrease in correlation score.

Additionally, or alternatively, decision component 436 may determine the decoded value based on information provided by clock recovery component 438. Clock recovery component 438 may be capable of estimating when a bit has been received. For example, clock recovery component 438 may identify a known start bit and may determine a length of time associated with receiving a bit (e.g., based on identifying a time at which the known start bit was received). Here, clock recovery component 438 may estimate a time at which other bits may be received, and may cause decision component 436 to determine the correlation score at the appropriate estimated times. As such, decision component 436 may not be required to monitor the correlation score for sharp increases or sharp decreases.

The number and arrangement of components shown in FIG. 4 are provided as an example. In practice, ECU 220 may include additional components, fewer components, different components, or differently arranged components than those shown in FIG. 4. Additionally, or alternatively, a set of components (e.g., one or more components) of ECU 220 may perform one or more functions described as being performed by another set of components of ECU 220.

Figure 5A:
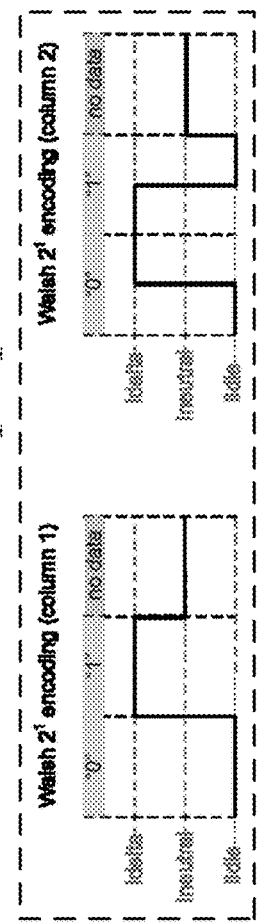
FIGS. 5A and 5B are diagrams that show an example of Walsh encoding and decoding using a first order Walsh matrix for PSI5.
Figure 5A:
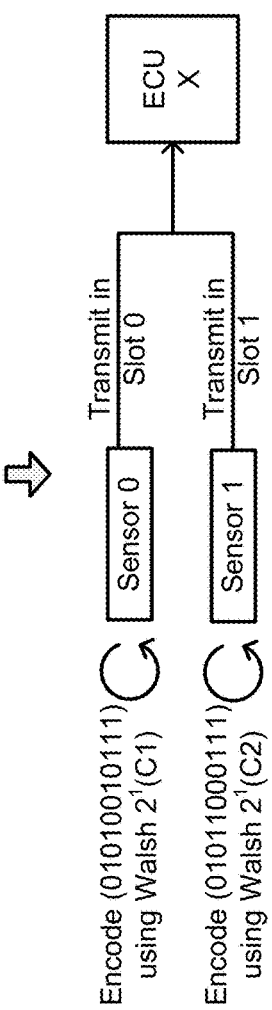
Figure 5B:
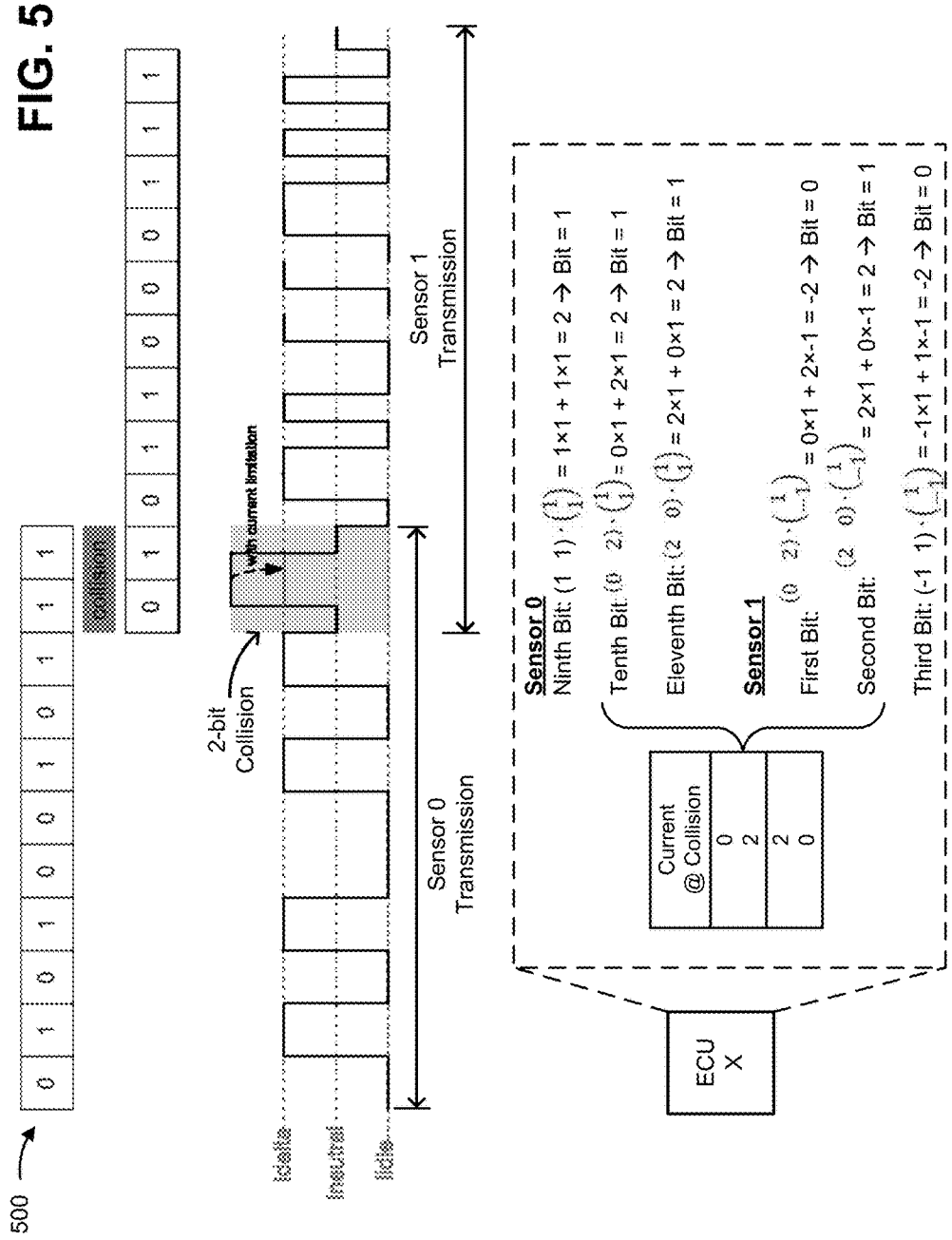

FIGS. 5A and 5B are diagrams that show an example 500 of Walsh encoding and decoding using a first order Walsh matrix for PSI5. In some implementations, Walsh encoding and decoding using a first order Walsh matrix for PSI5 may allow for an increased throughput and/or a relaxed clock accuracy requirement, even in the presence of bit collisions, as described below. For the purposes of example 500, assume that a first sensor (e.g., sensor 0), and a second sensor (e.g., sensor 1) are connected to ECU 220 (e.g., ECU X), and that sensor 0 and sensor 1 are to transmit data (e.g., to ECU X), using PSI5, in a first time slot (e.g., slot 0) and a second time slot (e.g., slot 1), respectively, with no time slot margin (e.g., such that sensor 1 may transmit in slot 1 immediately after slot 0 ends). Further, assume that sensor 0 is configured to encode data using the first column of the first order Walsh matrix, and that sensor 1 is configured to encode data using the second column of the first order Walsh matrix.

As shown in FIG. 5A, sensor 0 may encode a first string of bits (e.g., 01010010111), using the first column of the first order Walsh matrix, as a first group of sets of encoded values (e.g., where each bit is encoded as a set of two values of 1 and/or −1). As shown, sensor 0 may then begin transmitting the encoded first bit string in slot 0 (e.g., by modulating a current based on the first group of sets of encoded values). As further shown, sensor 1 may encode a second string of bits (e.g., 01011000111), using the second column of the first order Walsh matrix, as a second group of sets of encoded values. As shown, sensor 1 may then transmit the encoded second bit string in slot 1 (e.g., by modulating the current based on the second group of sets of encoded values).

However, as shown in the upper portion FIG. 5B, assume, due to a clock inaccuracy of sensor 1, that sensor 1 begins transmitting the encoded second bit string before sensor 0 finishes transmitting the encoded first bit string such that the current levels representing the last two bits of the encoded first bit string overlap with the current levels representing the first two bits of the encoded second bit string. In other words, assume that the last two bits of the encoded first bit string collide with the first two bits of the encoded second bit string at the ECU X.

As shown in the lower portion of FIG. 5B, ECU X may decode the first nine bits of the encoded first bit string based on sets of current values that correspond to the first encoded bit string. For example, ECU X may detect a set of current values (e.g., (1 1)) that corresponds to the ninth bit of the encoded first bit string and may decode the ninth bit based on the first column of the first order Walsh matrix, as 1 (e.g., $(1\ 1) \times (1\ 1)^t = 1 \times 1 + 1 \times 1 = 2 \to \text{Bit} = 1$). ECU X may similarly decode the first eight bits of the first encoded bit string. Similarly, ECU X may determine that no sensor 1 data was received during the time at which the ninth bit of the first bit string was received (e.g., since $(1\ 1) \times (1\ -1)^t = 1 \times 1 + 1 \times -1 = 0 \to$ no data).

As further shown in the lower portion of FIG. 5B, ECU X may also decode the encoded data associated with the collision. As shown, ECU X may determine two sets of current values that correspond to current levels detected during each chip of a four chip period corresponding to the collision. As shown, a first set of current values may include (0 2) and a second set of current values may include (2 0). As further shown, ECU X may determine (e.g., using the first column of the first order Walsh matrix) the decoded value of the tenth bit of the encoded first bit string as 1 (e.g., $(0\ 2) \times (1\ 1)^t = 0 \times 1 + 2 \times 1 = 2 \to \text{Bit} = 1$) and the decoded value of the eleventh bit of the encoded first bit string as 1 (e.g., $(2\ 0) \times (1\ 1)^t = 2 \times 1 + 0 \times 1 = 2\ \text{Bit} = 1$). Similarly, ECU X may determine (e.g., using the second column of the first order Walsh matrix) the decoded value of the first bit of the encoded second string as 0 (e.g., $(0\ 2) \times (1\ -1)^t = 0 \times 1 + 2 \times -1 = -2 \to \text{Bit} = 0$), and the decoded value of the second bit of the encoded second string as 1 (e.g., $(2\ 0) \times (1\ -1)^t = 2 \times 1 + 0 \times -1 = 2 \to \text{Bit} = 1$). ECU X may then decode the remaining nine bits of the encoded second bit string in a similar manner (e.g., the third bit of the encoded second bit string may be decoded as $(-1\ 1) \times (1\ -1)^t = -1 \times 1 + 1 \times -1 = -2 \to \text{Bit} = 0$).

Here, since ECU X is capable of resolving bit collisions, the time slot margin between slot 0 and slot 1 may be set to zero, as described above. Alternatively, in some implementations, the time slot margin may be reduced to less than zero (e.g., such that collisions are induced). For example, a sensor may be configured to begin transmitting in a time slot before another sensor finishes transmitting in a time slot immediately preceding the time slot. In this way, throughput may be further increased. However, in such a case, a limitation for a worst case clock may be implemented in order to ensure that a first time slot (e.g., slot N−2) does not interfere with a third time slot (e.g., slot N), since code diversity would be lost in the case of such interference. In other words, for a worst case clock, time slot N−2 may not interfere with time slot N (i.e., a worst start time of a transmission in time slot N is to be after a worst end time of a transmission in slot N−2 plus a slot margin).

Additionally, or alternatively, a sync pulse may be omitted (e.g., since TDMA organization with the sync pulse is not needed due to allowing overlaps). In such a case, a sensor system may be simplified (e.g., since sensor 210 may not need to detect the sync pulse or manage a varying supply voltage, since ECU 220 may not need to generate the sync pulse and switch the sync pulse with a supply voltage, etc.) and/or throughput may be further increased (e.g., since no portion of a sync period needs to be reserved for the sync pulse).

In this way, Walsh encoding using a first order Walsh matrix may be used for transmitting sensor data using PSI5 such that an amount of throughput may be increased and/or a clock accuracy requirement may be relaxed (e.g., as compared to using Manchester encoding for PSI5). As described above, use of Manchester encoding for PSI5 standard P10P-500-3L may limit the amount of throughput for a given sensor to 26 kbps even with an optimal condition (e.g., optimal clock accuracy, optimal time slot durations, optimal time slot margins, etc.), whereas use of Walsh encoding for PSI5 standard P10P-500-3L may allow for 32 kbps of throughput: for a given 500 µs sync period, a 50 µs sync pulse, and using a ±10% clock accuracy requirement, approximately 400 µs may be available for transmission of sensor data (e.g., (500 µs−50 µs)×0.9=400 µs). Thus, with three available time slots, and a time slot margin of zero, each time slot may be approximately 133 µs long (e.g., 400 µs/3). At a data rate of 125 kbps, approximately 16 bits are available per frame (e.g., 133 µs×125 kbps=16 bits). As such, the amount of throughput may be approximately 32 kbps (e.g., 16 bits per frame/500 µs=32 kbps), which is approximately a 23% increase in throughput as compared to use of Manchester coding.

As indicated above, FIGS. 5A and 5B are provided merely as an example. Other examples are possible and may differ from what was described with regard to FIGS. 5A and 5B.

Figure 6B:
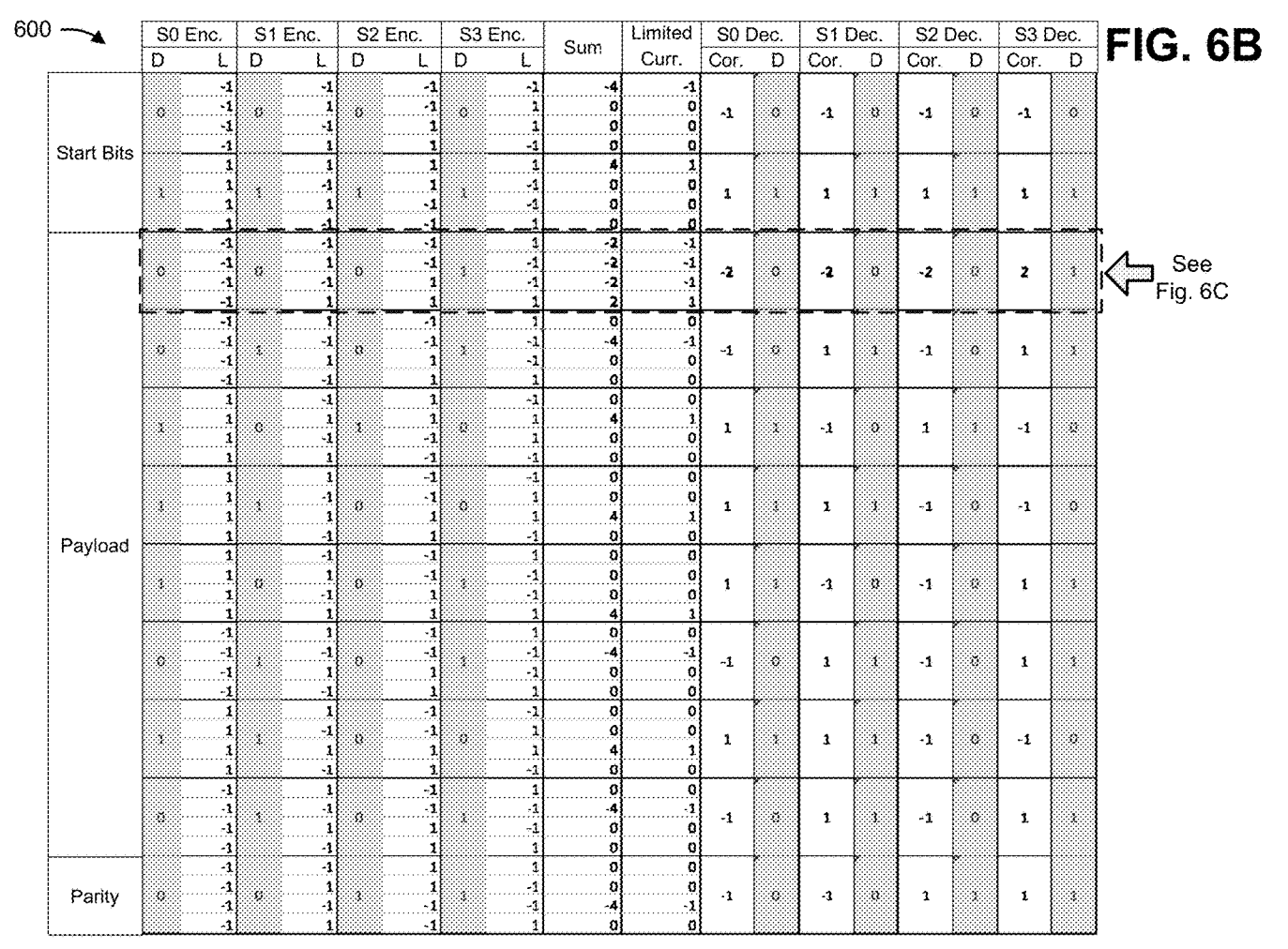
Figure 6C:

FIGS. 6A-6C are diagrams that show an example 600 of Walsh encoding and decoding using a second order Walsh matrix for PSI5. In some implementations, Walsh encoding and decoding using a second order Walsh matrix for PSI5 may allow for an increased amount of throughput (e.g., as compared to using Manchester encoding), as described below. For the purposes of example 600, assume that a first sensor (e.g., sensor 0), a second sensor (e.g., sensor 1), a third sensor (e.g., sensor 2), and a fourth sensor are connected to ECU 220 (e.g., ECU X), and that each sensor is configured to transmit Walsh encoded data (e.g., to ECU X), using PSI5, in any time slot. Further, assume that sensor 0 is configured to encode data using the first column of the second order Walsh matrix, that sensor 1 is configured to encode data using the second column of the second order Walsh matrix, that sensor 2 is configured to encode data using the third column of the second order Walsh matrix, and that sensor 3 is configured to encode data using the fourth column of the second order Walsh matrix.

As shown in FIG. 6A, sensor 0 may encode a first string of bits (e.g., 01001110100), using the first column of the second order Walsh matrix, as a first group of sets of encoded values (e.g., where each bit is encoded as a sequence (set) of four chips having values of 1 or −1). Sensor 1, sensor 2, and sensor 3 may similarly encode respective strings of bits using the appropriate column of the second order Walsh matrix. As shown, assume that, after encoding the sensor data, sensor 0, sensor 1, sensor 2, and sensor 3 concurrently transmit (e.g., in a single time slot) an encoded first string of bits, an encoded second string of bits, an encoded third string of bits, and an encoded fourth string bits to ECU X, respectively (e.g., by modulating a current based on the sets of encoded values).

FIG. 6B includes a table that shows an example of a manner in which sensor 0, sensor 1, sensor 2, and sensor 3 may encode their respective bit strings, as well as a manner in which ECU X may decode each bit based on sets of current levels detected by ECU X. Example calculations for a particular bit (e.g., a first payload bit transmitted by each sensor) are shown in FIG. 6C.

As shown in the table included in FIG. 6C, sensor 0 may encode a first sensor 0 payload bit based on the first column of the second order Walsh matrix (e.g., 0→(−1 −1 −1 −1)), sensor 1 may encode a first sensor 1 payload bit based on the second column of the second order Walsh matrix (e.g., 0→(−1 1 −1 −1)), sensor 2 may encode a first sensor 2 payload bit based on the third column of the second order Walsh matrix (e.g., 0→(−1 −1 1 1)), sensor 3 may encode a first sensor 3 payload bit based on the fourth column of the second order Walsh matrix (e.g., 1→(1 −1 −1 1)). Each sensor may then modulate a current level, to be detected by ECU X, based on the encoded bits. As a result of concurrent transmission, the current level during each chip of the first payload bits may be (−2 −2 −2 2), as shown in the "Sum" column of the table of FIG. 6C (e.g., where 2 represents a current that is equal to the neutral current plus two times the delta current, and where −2 represents a current that is equal to the neutral current minus two times the idle current).

As shown, ECU X or other circuitry, may limit the detected current such that ECU X determines a set of current values of (−1 −1 −1 1) associated with chips corresponding to the first payload bits. As shown, ECU X may then determine, based on the set of current values and the columns of the second order Walsh matrix, a correlation score for the first sensor 0 payload bit, the first sensor 1 payload bit, the first sensor 2 payload bit, and the first sensor 3 payload bit. ECU X may then determine each decoded payload bit based on corresponding correlation scores.

If applying the respective encoding scheme used by a particular sensor to the received current levels achieves a positive correlation score, the received data bit for the sensor is determined to be a logical 1. If the correlation score is negative, then the received data bit for the sensor is determined to be a logical 0. This is done for the encoding schemes of each sensor to determine all data bits that are transmitted in the time slot by the sensors. As shown, with respect to the first sensor 0 payload bit, ECU X may determine a correlation score of −2 and may decode the first sensor 0 payload bit as 0 (e.g., $(-1\ -1\ -1\ 1) \times (1\ 1\ 1\ 1)^t = -1 \times 1 + -1 \times 1 + -1 \times 1 + 1 \times 1 = -2 \rightarrow \text{Bit} = 0$). As further shown, with respect to the first sensor 1 payload bit, ECU X may determine a correlation score of −2 and may decode the first sensor 1 payload bit as 0 (e.g., $(-1\ -1\ -1\ 1) \times (1\ -1\ 1\ -1)^t = -1 \times 1 + -1 \times -1 + -1 \times 1 + 1 \times -1 = -2 \rightarrow \text{Bit} = 0$). As shown, with respect to the first sensor 2 payload bit, ECU X may determine a correlation score of −2 and may decode the first sensor 2 payload bit as 0 (e.g., $(-1\ -1\ -1\ 1) \times (1\ 1\ -1\ -1)^t = -1 \times 1 + -1 \times 1 + -1 \times -1 + 1 \times -1 = -2 \rightarrow \text{Bit} = 0$). As shown, with respect to the first sensor 3 payload bit, ECU X may determine a correlation score of 2 and may decode the first sensor 3 payload bit as 1 (e.g., $(-1\ -1\ -1\ 1) \times (1\ -1\ -1\ 1)^t = 1 \times 1 + -1 \times -1 + -1 \times -1 + 1 \times 1 = 2 \rightarrow \text{Bit} = 1$). ECU X may decode other bits in a similar manner.

Here, since ECU X is capable of resolving concurrently transmitted encoded data, an amount of throughput may be increased. In this way, Walsh encoding using a second order Walsh matrix may be used for transmitting sensor data using PSI5 such that an amount of throughput may be increased (e.g., as compared to using Manchester encoding for PSI5). Moreover, use of Walsh encoding in this manner may allow a technique that is similar to a CDMA technique to be implemented for current modulation.

For a comparison with Manchester encoding, assume that for a given 500 µs sync period with a 50 µs sync pulse and a ±10% clock accuracy requirement, approximately 400 µs may be available for transmission of sensor data (e.g., (500 µs−50 µs)×0.9=400 µs). Further assume that, similar to Manchester encoding, each chip is 4 µs in duration (e.g., since transmission at 125 kbps may require 8 µs per bit with Manchester coding, thus 4 µs per chip). Since, Walsh encoding using the second order Walsh matrix necessitates 16 µs per bit (e.g., 4 chips/bit×4 µs/chip=16 µs/bit), and since all sensors transmit concurrently during the available sync period, the available quantity of bits per sensor is 25 bits (e.g., 400 μs/16 μs/bit=25 bit). As such, the total throughput per sensor is 50 kbps (e.g., 25 bits/500 μs=50 kbps). This represents an approximately 92% increase in throughput as compared to Manchester encoding for the same chip duration (e.g., (50 kbps/26 kbps)−1=0.92).

As indicated above, FIGS. 6A-6C are provided merely as an example. Other examples are possible and may differ from what was described with regard to FIGS. 6A-6C.

FIG. 7 is a flow chart of an example process 700 for decoding encoded first data based on first encoding scheme and decoding encoded second data based on a second encoding scheme. In some implementations, one or more process blocks of FIG. 7 may be performed by devices of environment 200.

As shown in FIG. 7, process 700 may include encoding first data using a first encoding scheme (block 710). For example, a first sensor 210 may encode first data (e.g., data sensed by the first sensor 210 and to be transmitted to ECU 220), based on a first encoding scheme. In some implementations, the first encoding scheme may be based on a first column of a Walsh matrix, as described above. In some implementations, the first sensor 210 may modulate a current in order to provide the first encoded data to ECU 220, as described above.

As shown in FIG. 7, process 700 may include encoding second data using a second encoding scheme (block 720). For example, a second sensor 210 may encode second data (e.g., data sensed by the second sensor 210 and to be transmitted to ECU 220), based on a second encoding scheme. In some implementations, the second encoding scheme may be based on a second column of the Walsh matrix, as described above. In some implementations, the second sensor 210 may modulate the current in order to provide the second encoded data to ECU 220, as described above.

As shown in FIG. 7, process 700 may include decoding the encoded first data based on the first encoding scheme and the encoded second data based on the second encoding scheme (block 730). For example, ECU 220 may decode the encoded first data based on the first encoding scheme and the encoded second data based on the second encoding scheme. In some implementations, ECU 220 may decode the first encoded data and the second encoded data based on the first column of the Walsh matrix and the second column of the Walsh matrix, respectively, as described above.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Implementations described herein may use Walsh encoding for transmitting sensor data using PSI5. Use of Walsh encoding may allow for an increased amount of throughput and/or a relaxed clock accuracy requirement as compared to using Manchester encoding for PSI5. Moreover, use of Walsh encoding for PSI5 may allow a code division multiple access (CDMA) technique to be implemented for current modulation.

Additionally, Walsh encoding for PSI5 may allow for enhanced functional safety between data transmitted by two sensors (e.g., on a single channel). For example, using a combination of CDMA and TDMA (e.g., by encoding data using a Walsh matrix and configuring only one of the two sensors to transmit in a given time slot), sensor data sent in an incorrect time slot may not be recognized by ECU 220.

Additionally, Walsh encoding for PSI5 may allow for keep-alive behavior without maintaining a keep-alive counter. For example, in a case where one or two sensors are transmitting data, the data may be encoded using a different column of the Walsh matrix for every sync period. Here, a loss of synchronization may result in an unrecognized frame.

The foregoing disclosure provides illustration and description, but is not intended to be exhaustive or to limit the implementations to the precise form disclosed. Modifications and variations are possible in light of the above disclosure or may be acquired from practice of the implementations. For example, while implementations described herein are described in the context of first and second order Walsh matrices, in some implementations, another type of matrix may be used for data encoding, such as a third order Walsh matrix, a Hadamard matrix (e.g., a square matrix with entries of either −1 or 1 and including mutually orthogonal columns), or another type of square matrix with dimensions of $2^n$ (e.g., n=1, 2, 3, 4, etc.) that includes values of 1 and −1 such that a scalar product of any two columns is equal to zero.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:
1. A group of sensors, comprising:
   a first sensor to:
      encode first data using a first encoding scheme,
         the first encoding scheme including encoding a data bit, included in the first data, using a first chip sequence that corresponds to a first set of current levels; and;
      modulate a first current, based on the first set of current levels, to provide encoded first data; and
   a second sensor to:
      encode second data using a second encoding scheme,
         the second encoding scheme encoding a data bit, included in the second data, using a second chip sequence that corresponds to a second set of current levels,
         the first chip sequence and the second chip sequence being different chip sequences; and
      modulate a second current, based on the second set of current levels, to provide encoded second data.

2. The group of sensors of claim 1, where the first sensor and the second sensor are connected to a control unit via a Peripheral Sensor Interface.

3. The group of sensors of claim 1, where the first encoding scheme is associated with a column of a Walsh matrix and the second encoding scheme is associated with another column of the Walsh matrix.

4. The group of sensors of claim 1, where the first sensor, when modulating the first current to provide the first encoded data, are to:
encode the data bit, included in the first data, across multiple chips, associated with the data bit, in correspondence with a column of a Walsh matrix.

5. The group of sensors of claim 1, where first sensor, when modulating the first current, is to modulate the first current to form a first modulated current in a first time slot of a plurality of time slots,
where the second sensor, when modulating the second current, is to modulate the second current to form a second modulated current in a second time slot of the plurality of time slots,
where a time slot margin between the first time slot and the second time slot is less than or equal to zero.

6. The group of sensors of claim 1, where the first sensor, when modulating the first current to provide the first encoded data is to:
modulate the first current based on a current level, of the first set of current levels, during a first chip associated with the data bit included in the first data,
the first set of current levels including a first current level and a second current level, and
the current level being the first current level or the second current level; and
modulate the first current based on another current level, of the first set of current levels, during a second chip associated with the data bit included in the first data,
the other current level being the first current level or the second current level.

7. The group of sensors of claim 1, where the first sensor is further to:
output a neutral current when the first sensor is not providing any encoded data,
the neutral current being at a current level that is different than current levels included in the first set of current levels.

8. A control unit, comprising:
a converter to:
convert first analog signals, received via a peripheral sensor interface and from a first sensor, to current values corresponding to first encoded data, and
convert second analog signals, received via the peripheral sensor interface and from a second sensor, to current values corresponding to second encoded data and one or more receivers to:
decode the first encoded data using a first portion of a Hadamard matrix, and
decode the second encoded data using a second portion of the Hadamard matrix,
the second portion of the Hadamard matrix being different than the first Portion of the Hadamard matrix.

9. The control unit of claim 8, where the first portion of the Hadamard matrix is a first column of a first order Walsh matrix and the second portion of the Hadamard matrix is a second column of the first order Walsh matrix.

10. The control unit of claim 8, where the first portion of the Hadamard matrix is a first column of a second order Walsh matrix, a second column of the second order Walsh matrix, a third column of the second order Walsh matrix, or a fourth column of the second order Walsh matrix.

11. The control unit of claim 8, where the one or more receivers are to:
determine a set of current values that represents the first encoded data;
determine a set of values from the first portion of the Hadamard matrix; and
combine the set of current values and the set of values to obtain a correlation score associated with the first encoded data; and
where the one or more receivers, when decoding the first encoded data, are to:
decode the first encoded data based on the correlation score.

12. The control unit of claim 8, where the receiver is further to:
receive the first encoded data transmitted from the first sensor in a first time slot of a plurality of time slots, and
receive the second encoded data transmitted from the second sensor in a second time slot of a plurality of time slots,
where a time slot margin between the first time slot and the second time slot is less than or equal to zero.

13. The control unit of claim 8,
where the one or more receivers are further to:
receive the first encoded data and the second encoded data from the converter,
the second encoded data being at least partially concurrently received with the first encoded data forming a bit collision, and
resolve the bit collision based on decoding data associated with the bit collision using the first portion of a Hadamard matrix and the second portion of the Hadamard matrix.

14. The control unit of claim 8, where the converter receives the first encoded data as a modulated current formed by the first sensor.

15. A method, comprising:
encoding, by a first sensor, first data using a first encoding scheme,
the first encoding scheme including encoding a data bit, included in the first data, based on a first chip sequence that corresponds to a first set of current levels;
providing, by the first sensor and by modulating a first current, encoded first data to a control unit via a peripheral sensor interface;
encoding, by a second sensor, second data using a second encoding scheme,
the second encoding scheme including encoding a data bit, included in the second data, based on a second chip sequence that corresponds to a second set of current levels,
the first chip sequence being different than the second chip sequence;
providing, by the second sensor and by modulating a second current, encoded first data to the control unit via the peripheral sensor interface; and
decoding, by the control unit, the encoded first data based on the first encoding scheme and the encoded second data based on the second encoding scheme.

16. The method of claim 15, where the first encoding scheme or the second encoding scheme correspond to a first column of a first order Walsh matrix or a second column of the first order Walsh matrix.

17. The method of claim 15, where the first encoding scheme or the second encoding scheme correspond to a first column of a second order Walsh matrix, a second column of the second order Walsh matrix, a third column of the second order Walsh matrix, or a fourth column of the second order Walsh matrix.

18. The method of claim 15, where decoding the encoded first data comprises:
- determining a set of current values that represents the encoded first data;
- determining a set of values associated with the first encoding scheme; and
- combining the set of current values and the set of values to obtain a score associated with the encoded first data; and
- decoding the encoded first data based on the score.

19. The method of claim 15, further comprising:
- outputting, by the first sensor, a neutral current when the first sensor is not providing any encoded data; and
- outputting, by the second sensor, the neutral current when the second sensor is not providing any encoded data,
  - the neutral current being at a current level that is different than current levels included in the first set of current levels and the second set of current levels.

20. The method of claim 19, where the current level of the neutral current is less than a maximum current level of the first set of current levels and greater than a minimum current level of the first set of current levels.

* * * * *